(12) United States Patent
Then et al.

(10) Patent No.: US 9,362,369 B2
(45) Date of Patent: Jun. 7, 2016

(54) GROUP III-N TRANSISTORS ON NANOSCALE TEMPLATE STRUCTURES

(71) Applicant: Intel Corporation, Santa Clara, CA (US)

(72) Inventors: Han Wui Then, Portland, OR (US); Sansaptak Dasgupta, Hillsboro, OR (US); Marko Radosavljevic, Portland, OR (US); Benjamin Chu-Kung, Hillsboro, OR (US); Sanaz Gardner, Hillsboro, OR (US); Seung Hoon Sung, Beaverton, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/937,819

(22) Filed: Nov. 10, 2015

(65) Prior Publication Data

US 2016/0064491 A1 Mar. 3, 2016

Related U.S. Application Data

(60) Continuation of application No. 14/581,722, filed on Dec. 23, 2014, now Pat. No. 9,219,079, which is a continuation of application No. 14/303,513, filed on Jun. 12, 2014, now Pat. No. 8,954,021, which is a division of application No. 13/720,852, filed on Dec. 19, 2012, now Pat. No. 8,768,271.

(51) Int. Cl.
*H01L 21/02* (2006.01)
*H01L 29/772* (2006.01)
(Continued)

(52) U.S. Cl.
CPC ........ *H01L 29/2003* (2013.01); *H01L 21/0254* (2013.01); *H01L 21/283* (2013.01); *H01L 29/42356* (2013.01); *H01L 29/785* (2013.01)

(58) Field of Classification Search
USPC .......................................... 257/192, 194, 200
See application file for complete search history.

(56) References Cited

U.S. PATENT DOCUMENTS

| 6,921,700 B2 | 7/2005 | Orlowski et al. |
| 7,253,061 B2 | 8/2007 | Peng et al. |

(Continued)

FOREIGN PATENT DOCUMENTS

| JP | 2006-216770 | 8/2006 |
| JP | 2011-066362 A | 3/2011 |

(Continued)

OTHER PUBLICATIONS

International Search Report and Written Opinion for Application No. PCT/US2011/065916 dated Sep. 25, 2012, 7 pages.
(Continued)

*Primary Examiner* — Blane J Jackson
(74) *Attorney, Agent, or Firm* — Blakely, Sokoloff, Taylor & Zafman LLP

(57) ABSTRACT

A III-N semiconductor channel is formed on a III-N transition layer formed on a (111) or (110) surface of a silicon template structure, such as a fin sidewall. In embodiments, the silicon fin has a width comparable to the III-N epitaxial film thicknesses for a more compliant seeding layer, permitting lower defect density and/or reduced epitaxial film thickness. In embodiments, a transition layer is GaN and the semiconductor channel comprises Indium (In) to increase a conduction band offset from the silicon fin. In other embodiments, the fin is sacrificial and either removed or oxidized, or otherwise converted into a dielectric structure during transistor fabrication. In certain embodiments employing a sacrificial fin, the III-N transition layer and semiconductor channel is substantially pure GaN, permitting a breakdown voltage higher than would be sustainable in the presence of the silicon fin.

10 Claims, 6 Drawing Sheets

(51) Int. Cl.
*H01L 29/66* (2006.01)
*H01L 29/20* (2006.01)
*H01L 29/423* (2006.01)
*H01L 29/78* (2006.01)
*H01L 21/283* (2006.01)

(56) References Cited

U.S. PATENT DOCUMENTS

| | | | |
|---|---|---|---|
| 7,268,058 B2 | 9/2007 | Chau et al. | |
| 7,655,994 B2 | 2/2010 | Cartier et al. | |
| 7,727,830 B2 | 6/2010 | Jin et al. | |
| 7,821,061 B2 | 10/2010 | Jin et al. | |
| 8,076,699 B2 | 12/2011 | Chen et al. | |
| 8,492,228 B1 | 7/2013 | Leobandung et al. | |
| 8,921,894 B2* | 12/2014 | Ando | 257/194 |
| 2005/0116218 A1 | 6/2005 | Yang | |
| 2005/0121765 A1 | 6/2005 | Lin | |
| 2006/0091432 A1 | 5/2006 | Guha et al. | |
| 2006/0108606 A1* | 5/2006 | Saxler | H01L 21/318 257/200 |
| 2006/0214156 A1 | 9/2006 | Pan et al. | |
| 2006/0289761 A1 | 12/2006 | Nabet et al. | |
| 2007/0004117 A1 | 1/2007 | Yagishita | |
| 2007/0187716 A1 | 8/2007 | Chu | |
| 2007/0241399 A1 | 10/2007 | Irisawa et al. | |
| 2008/0142841 A1 | 6/2008 | Lindert et al. | |
| 2008/0161073 A1 | 7/2008 | Park et al. | |
| 2009/0045438 A1* | 2/2009 | Inoue | H01L 29/155 257/192 |
| 2009/0189190 A1* | 7/2009 | Hashimoto | H01L 21/02389 257/194 |
| 2009/0194791 A1 | 8/2009 | Kanamura | |
| 2010/0059807 A1 | 3/2010 | Cho et al. | |
| 2010/0155701 A1 | 6/2010 | Radosavljevic et al. | |
| 2010/0163926 A1 | 7/2010 | Hudait et al. | |
| 2010/0295021 A1 | 11/2010 | Chang et al. | |
| 2011/0024794 A1 | 2/2011 | Ko et al. | |
| 2011/0068404 A1 | 3/2011 | Sugiura et al. | |
| 2011/0108803 A1 | 5/2011 | Deligianni et al. | |
| 2011/0133166 A1 | 6/2011 | Bangsaruntip et al. | |
| 2011/0147842 A1 | 6/2011 | Cappellani et al. | |
| 2011/0156004 A1 | 6/2011 | Radosavljevic et al. | |
| 2011/0169012 A1 | 7/2011 | Hersee et al. | |
| 2012/0015493 A1 | 1/2012 | Lin et al. | |
| 2014/0038369 A1 | 2/2014 | Adam et al. | |
| 2014/0094223 A1* | 4/2014 | Dasgupta | H01L 29/66462 455/566 |

FOREIGN PATENT DOCUMENTS

| | | |
|---|---|---|
| KR | 10-2010-0075250 | 7/2010 |
| KR | 10-2011-0098594 | 9/2011 |
| KR | 10-2012-0012454 | 2/2012 |

OTHER PUBLICATIONS

International Application No. PCT/US2011/065916 filed Dec. 19, 2011, 41 pages.
"GaN Stripes on Vertical {111} Fin Facets of (110)-Oriented Si Substrates," by Kuryatkov et al., Applied Physics Letters 96, 073107 (2010), 4 pages.
Office Action from the Taiwan Intellectual Property Office (IPO) dated Jul. 21, 2015 for Taiwan Patent Application No. 102141483 and English Translation thereof.
International Search Report and Written Opinion mailed Sep. 25, 2013 for PCT/US2013/047428 filed Jun. 24, 2013.
International Search Report and the Written Opinion of the International Searching Authority, PCT/US2011/061623, Jun. 21, 2012, 7 pages.
Authority, PCT/US2011/061623, Jun. 21, 2012, 7 pages.
International Search Report and Written Opinion for International Application No. PCT/US2011/067220 mailed Aug. 1, 2012, 7 pages.
International Application No. PCT/US2011/067220 filed Dec. 23, 2011, titled, "III-N Material Structure for Gate-Recessed Transistors," 32 pages.
International Search Report and Written Opinion for Application No. PCT/US2011/065916 dated Sep. 25, 2012, 2012, 7 pages.
International Application No. PCT/US2011/065916 filed Dec. 19, 2011, titled, "High Voltage Field Effect Transistors," 41 pages.
"GaN Stripes on Vertical {111} Fin Facets of (110)-Oriented Si Substrates," by Kuryatkov et al., AIP Applied Physics Letters 96, 073107 (2010), 4 pages.
International Search Report and Written Opinion for International Application No. PCT/US2011/065922 mailed Sep. 7, 2012, 7 pages.
International Application No. PCT/US2011/065922 filed Dec. 19, 2011, titled "Non-Planar III-N Transistor," 36 pages.
International Search Report and Written Opinion for International Application No. PCT/US2011/065919 dated Aug. 30, 2012, 6 pages.
International Application No. PCT/US2011/065919 filed Dec. 19, 2011, titled, "Group III-N Nanowire Transistors," 36 pages.
International Search Report and Written Opinion for International Application No. PCT/US2011/065921 mailed Sep. 3, 2012, 8 pages.
International Application No. PCT/US2011/065921 filed Dec. 19, 2011, titled, "Group III-N Transistors for System on Chip (SOC) Architecture Integrating Power Management and Radio Frequency Circuits," 32 pages.
U.S. Appl. No. 13/627,971, filed Sep. 26, 2012, titled "Non-Planar III-V Field Effect Transistors with Conformal Metal Gate Electrode and Nitrogen Doping of Gate Dieletric Interface," 33 pages.
U.S. Appl. No. 13/629,178, filed Sep. 27, 2012, titled "Semiconductor Device Having Germanium Active Layer with Underlying Parasitic Leakage Barrier Layer," 44 pages.
Non-final Office Action for U.S. Appl. No. 13/629,178 mailed Aug. 6, 2013, 13 pages.
U.S. Appl. No. 13/629,178, filed Sep. 27, 2012, titled "Non-Planar Semiconductor Device Having Channel Region with Low Band-Gap Cladding Layer," 50 pages.
Non-final Office Action for U.S. Appl. No. 13/629,148 mailed Jul. 31, 2013, 22 pages.
Lauhon, et al., "Epitaxial Core-shell and Core-multishell Nanowire Heterostructure," 2002, Nature, vol. 420, Nov. 2002, pp. 57-61.
Dong, et al., "Coaxial Group III—Nitride Nanowire Photovoltaics," 2009, Nano Letters, vol. 9, No. 5, May 2009, pp. 2183-2187.
U.S. Appl. No. 13/631,514, filed Sep. 28, 2012, titled, "Epitaxial Buffer Layers for Group III-N Transistors on Silicon Substrates," 42 pages.
U.S. Appl. No. 13/631,534, filed Sep. 28, 2012, titled, "Self-Aligned Structures and Methods for Asymmetric Gan Transistors & Enhancement Mode Operation," 47 pages.
U.S. Appl. No. 13/631,569, filed Sep. 28, 2012, titled, "High Breakdown Voltage III-N Depletion Mode Mos Capacitors," 38 pages.
U.S. Appl. No. 13/630,527, filed Sep. 28, 2012, titled "Trench Confined Epitaxially Grown Device Layer(s)," 37 pages.
International Application No. PCT/US2011/067663 filed Dec. 28, 2011, titled, "Techniques and Configurations for Stacking Transistors of an Integrated Circuit Device," 55 pages.
International Application No. PCT/US2011/067667 filed Dec. 28, 2011, titled, "Contact Techniques and Configurations for Reducing Parasitic Resistance in Nanowire Transistors," 31 pages.

\* cited by examiner

GROUP III-N TRANSISTORS ON NANOSCALE TEMPLATE STRUCTURES

This is a Continuation of application Ser. No. 14/581,722 filed Dec. 23, 2014 which is a Continuation of application Ser. No. 14/303,513, filed Jun. 12, 2014 now U.S. Pat. 8,954,021 issued Feb. 10, 2015 which is Divisional Application of application Ser. No. 13/720,852 filed Dec. 19, 2012 now U.S. Pat. No. 8,768,271 issued Jul. 1, 2014.

TECHNICAL FIELD

Embodiments of the present invention generally relate to microelectronic devices and manufacture, and more particularly to group III-N transistor architectures.

BACKGROUND

The mobile computing (e.g., smart phone and tablet) markets benefit from smaller component form factors and lower power consumption. Because current platform solutions for smart phones and tablets rely on multiple packaged integrated circuits (ICs) mounted onto a circuit board, further scaling to smaller and more power efficient form factors is limited. For example, a smart phone will include a separate power management IC (PMIC), radio frequency IC (RFIC), and WiFi/Bluetooth/GPS IC, in addition to a separate logic processor IC. System on Chip (SoC) architectures offer the advantage of scaling, which cannot be matched by board-level component integration. While the logic processor IC may itself be considered a system on a chip (SoC) integrating both memory and logic functions, more extensive SoC solutions for mobile computing platforms have remained elusive because the PMIC and RFIC operate with two or more of high voltage, high power, and high frequency.

As such, conventional mobile computing platforms typically utilize incompatible transistor technologies that are specifically tailored for the different functions performed by the PMIC and RFIC. For example, laterally diffused silicon MOS (LDMOS) technology is typically employed in the PMIC to manage voltage conversion and power distribution (battery voltage regulation including step-up and/or step-down voltage conversion, etc.). Group III-V compound semiconductors, such a GaAs heterojunction bipolar transistors (HBTs), are typically utilized in the RFIC to generate sufficient power amplification at GHz carrier frequencies. Conventional silicon field effect transistors implementing CMOS technology then entail a third transistor technology utilized for logic and control functions within the mobile computing platform. In addition to fundamental semiconductor material incompatibilities between the various ICs in the mobile computing platform, transistor design for DC-to-DC conversion switches in the PMIC has been generally incompatible with the transistor design for high frequency power amplifiers in the RFIC. For example, the relatively low breakdown voltage of silicon requires source-to-drain separation in a DC-to-DC converter switch to be vastly larger than is permissible for a power amplifier transistor needing an Ft exceeding 20 GHz, and possibly up to 500 GHz, depending on the carrier frequency (e.g., WPAN is 60 GHz and so transistors need an Ft many times 60 GHz). Such different transistor-level design requirements render the fabrication processes for the various transistor designs distinct and difficult to integrate into a single process.

Therefore, while an SoC solution for the mobile computing space that would integrate PMIC and RFIC functions is attractive for improving scalability, lowering costs, and improving platform power efficiency, one barrier to an SoC solution is the lack of a scalable transistor technology having both sufficient speed (i.e., sufficiently high gain cutoff frequency, Ft), and sufficiently high breakdown voltage (BV).

Group III-nitride (III-N) devices offer a promising avenue for integration of PMIC and RFIC functions with CMOS as both high BV and Ft can be obtained. However, heteroepitaxy of III-N material stacks on silicon substrates poses a technical challenge for at least the reasons of significant lattice mismatch and thermal expansion mismatch, both of which can lead to high defect densities in device layers and poor device performance. Techniques and epitaxial semiconductor stack architectures which can provide reduced defect densities in device layers are therefore advantageous.

BRIEF DESCRIPTION OF THE DRAWINGS

Embodiments of the present invention are illustrated by way of example, and not by way of limitation, and can be more fully understood with reference to the following detailed description when considered in connection with the figures, in which.

DETAILED DESCRIPTION

Figure 1:
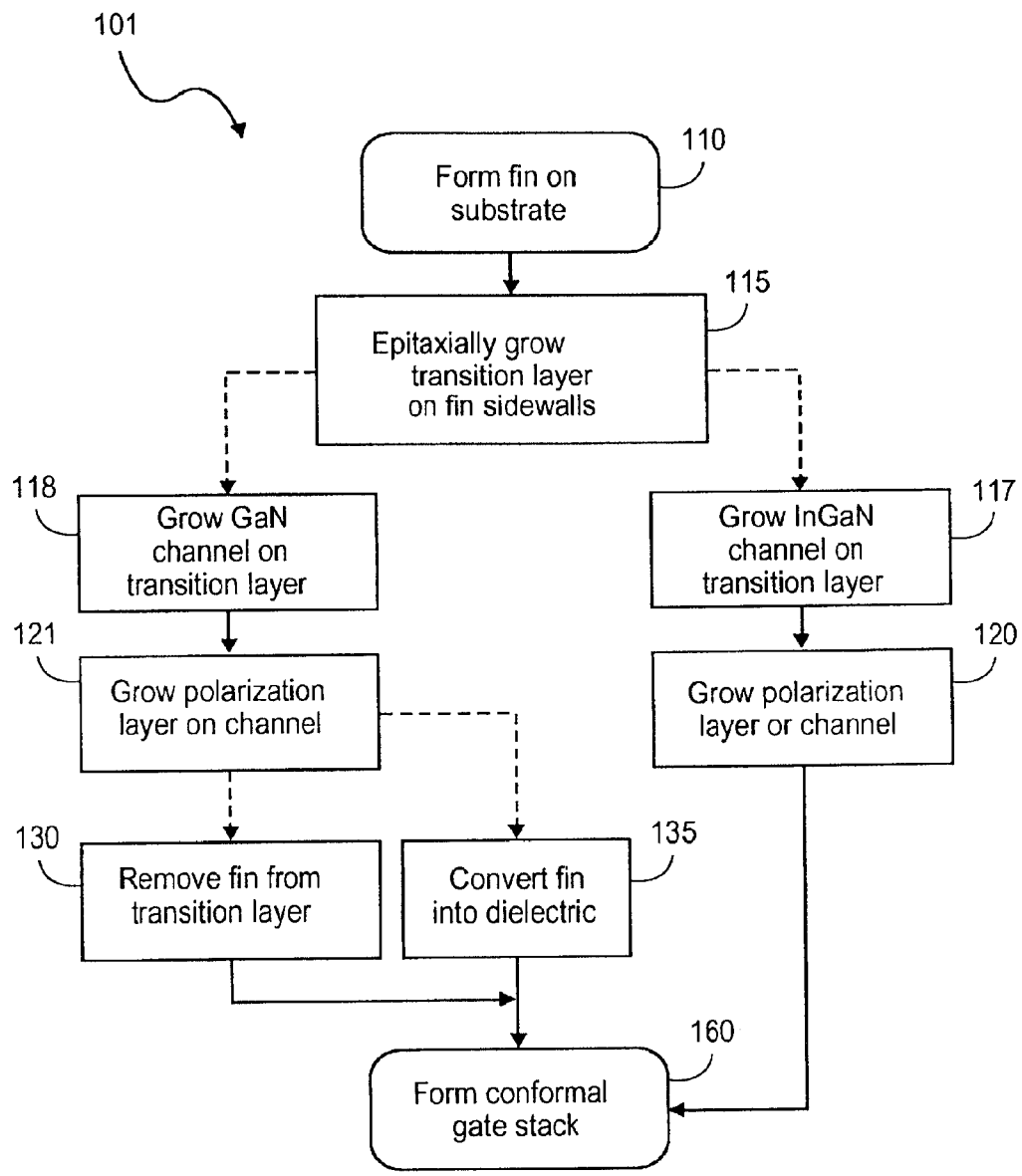
FIG. 1 is a flow diagram illustrating methods of fabricating a III-N field effect transistor (FET), in accordance with embodiments of the invention.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer.

Described herein are embodiments of III-N MOSFETs formed on template anchors, such as silicon fin sidewalls for reduced defect densities in III-N device layers. In embodiments, a III-N transition layer is formed on a (111) or (110) surface of a sidewall of a compliant crystalline silicon fin. A III-N semiconductor channel is further formed on the transition layer. In certain embodiments, the semiconductor channel comprises Indium (In) to increase a conduction band offset from the template anchor material. In other embodiments, the compliant crystalline silicon fin is sacrificial and either removed or oxidized, or otherwise converted into a dielectric anchor during transistor fabrication subsequent to the III-N epitaxy. In certain embodiments employing a sacrificial compliant epitaxial template, or mandrel, the III-N semiconductor channel is substantially pure GaN. Upon removal of the crystalline silicon epitaxial mandrel, a higher breakdown voltage can be sustained by the III-N transistor.

In embodiments, the high electron mobility FETs described herein are employed in SoC solutions integrating an RFIC with a PMIC to implement high voltage and/or high power circuits. With the transistor structures described herein, SoC solutions may deliver the product specific electrical current and power requirements needed for a mobile computing platform. The fast switching, high voltage transistors are capable of handling high input voltage swings and providing high power added efficiencies at RF frequencies. In embodiments, the III-N transistor architectures described herein are monolithically integrated with group IV transistor architectures, such as planar and non-planar silicon CMOS transistor technologies. In particular embodiments, the III-N transistors described herein are employed in SoC architectures integrating high power wireless data transmission and/or high voltage power management functions with low power CMOS logic data processing. High frequency operation suitable for broadband wireless data transmission applications is possible while the use of large band gap III-N materials also provides a high BV such that sufficient RF output power may be generated for the wireless data transmission applications. This combination of high $F_t/F_{max}$ and high voltage capability also enables the III-N FET architectures described herein to be used for high speed switching applications in DC-to-DC converters utilizing inductive elements of reduced size. As both the power amplification and DC-to-DC switching applications are key functional blocks in smart phones, tablets, and other mobile platforms, the structures described herein may be utilized in a SoC solution for such devices.

Figure 2A:
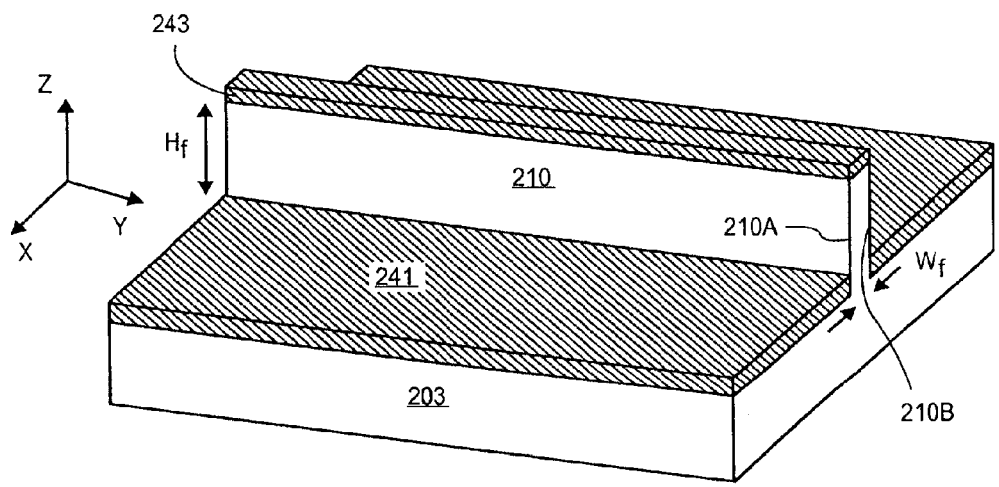
FIGS. 2A, 2B, and 2C illustrate isometric views as operations of the methods in FIG. 1 are performed on a substrate, in accordance with embodiments.
Figure 2B:
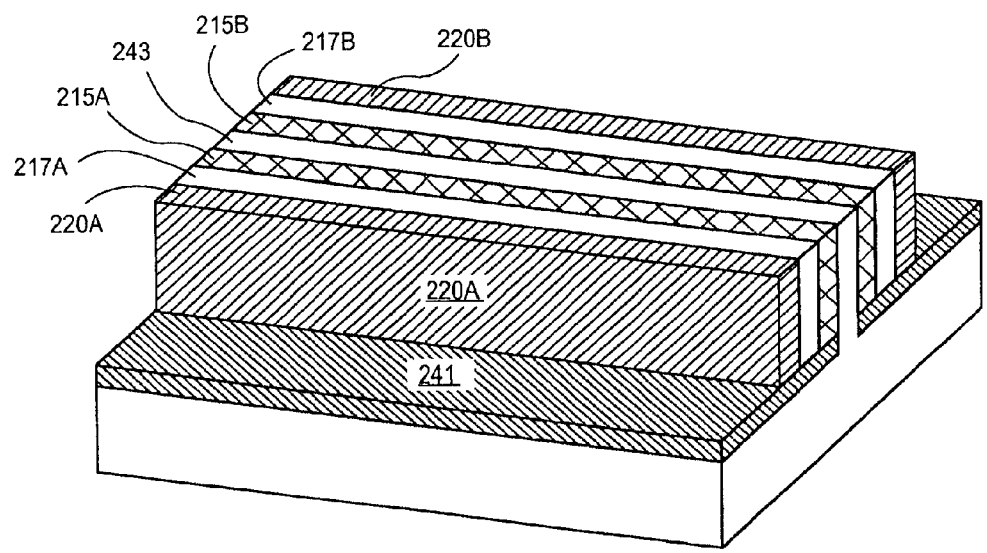
Figure 2C:
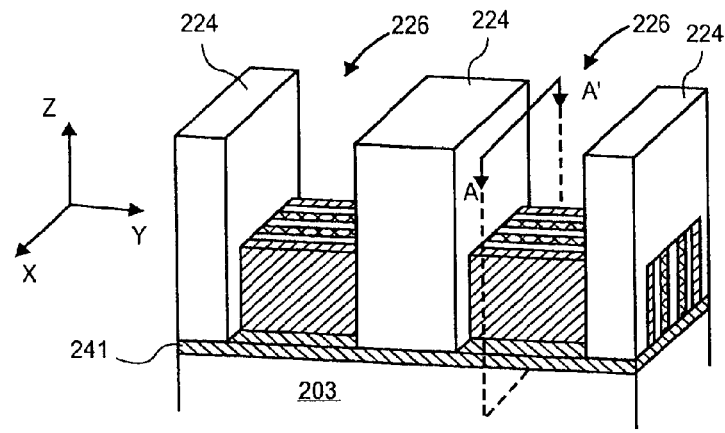

FIG. 1 is a flow diagram illustrating a method 101 of fabricating a III-N field effect transistor (FET), in accordance with embodiments of the invention. FIGS. 2A, 2B, and 2C illustrate isometric views as operations of the methods in FIG. 1 are performed on a substrate, in accordance with embodiments. Generally, the method 101 entails epitaxial growth of III-N semiconductor crystals on structured nanoscale template anchors which are then processed during device fabrication to provided III-N FET devices of suitable performance and can be integrated with CMOS fabrication. When of sufficiently small dimension, the structured epitaxial growth may reduce defects in the III-N devices layers from the ~1e9/cm2 typical of blanket III-N growths on silicon. With growth occurring on nanoscale surfaces of the template anchor, defects can be manipulated so as to be propagated into the anchor structure, thereby reducing the number of defects that would otherwise propagate into the III-N device films. One advantage of nanoscale structures is that they have a large surface-to-volume ratio providing large free surface area for relief of stresses formed due to the mismatch in thermal expansion coefficients and high growth temperatures.

Referring to FIG. 1, the method 101 begins at operation 110 with forming a template structure capable of seeding and anchoring III-N epitaxial films, for example in the shape of a fin on the substrate. In exemplary embodiments, the template anchor structures are of single crystalline silicon, and as further illustrated in FIG. 2A a fin 210 is formed in the substrate 203 with first and second opposing sidewalls 210A, 210B. In the exemplary embodiment, the substrate 203 is substantially monocrystalline and is (100) silicon (i.e., having a (100) top surface) or (110) silicon (i.e., having a (110) top surface). For (110) silicon embodiments, the vertical sidewalls 210A, 210B are (111) surfaces. (111) crystal planes are advantageous for III-N epitaxial growths because lattice mismatch is only approximately 16%. For (100) silicon embodiments, (110) planes are present on the fin sidewalls 210A, 210B when the sidewalls are orientated in the <110> direction on the (100) plane. (110) crystal planes are also advantageous for III-N epitaxial growths because (110) silicon planes have a mismatch with III-N between that of (111) Si and that of (100) Si (approximately 42%). Both of the (100) and (110) substrate crystal orientations are also advantageous for the formation of silicon transistors (e.g., in other regions not covered by III-N epitaxial layers) and therefore ideal for embodiments where a group III-N transistor formed on the fin 210 is to be monolithically integrated with silicon CMOS transistor technology. Notably, other substrates with similarly mismatched lattice constants may also benefit from the template anchors described herein, such as, but not limited to, substrates including germanium (Ge), which may be alloyed with silicon, or in a pure form.

In embodiments, epitaxial template anchor has surfaces with nanoscale dimensions. The surface area:volume ratio is an important characteristic of the structured template anchor affecting quality of the epitaxy with a higher free surface area improving epitaxially crystal quality. In the exemplary embodiment illustrated in FIG. 2A, the fin 210 has a fin width WF critical dimension (CD) less than 50 nm and advantageously less than 20 nm while the fin height HF less than 100 nm and advantageously between 25 nm and 100 nm where WF is less than 20 nm. As described further herein, the III-N epitaxial layers grown on the sidewalls 210A, 210B will ultimately be substantially thicker than the WF in the exemplary embodiment The narrow fin width WF will improve compliance of the fin 210 relative to a dimensionally larger block of silicon, such that the fin 210 may be strained (e.g., compressed) to reduce stress (e.g., tensile) in the III-N epitaxial layers that would otherwise be induced by the fin 210 if it were of greater width and less compliant. This compliance in the seed layer of the III-N epitaxial can permit much thinner III-N layers to achieve sufficient defect density for suitable III-N transistor characteristics.

In embodiments where the same III-N epitaxial stack is concurrently grown on the two sides of the fin, stress (strain) is symmetric about a longitudinal centerline of the fin 210 such that stress between the sides of the fin are advantageously balanced. The fin height HF being less than 100 nm has the advantage of being on the order of the dimension of III-N crystal grain coalescence. Hence, the fin 210 serves as a template structure with dimensions below 100 nm along at least 2 axes (z and x axes in FIG. 2). The third dimension, associated herein with a length of the fin, may be an order of magnitude, or more, greater than the axes of critical dimension (e.g., 1 µm, or more). With such dimensions, a defect density reduction of at least three orders of magnitude can be expected relative to a III-N epitaxial film growth on non-compliant seed layers (e.g., bulk substrate or large template structures of dimensions significantly greater than the thicknesses of the III-N epitaxial layers).

As further illustrated in FIG. 2A, the fin 210 is capped with a hard mask 243, such as silicon dioxide or other dielectric deposited by chemical vapor deposition (CVD), or other conventional technique. The hard mask 243 is patterned along with the fin 210 and may block subsequent epitaxial growth on the top surface of the fin 210. Adjacent to the fin 210 on either side of the fin sidewalls 210A, 210B is an isolation dielectric 241 covering the top surface of the substrate 203. The isolation dielectric 241 may be any conventional dielectric, such as those typically employed for trench isolation, etc (e.g., silicon dioxide). The presence of isolation dielectric 241 provides isolation between epitaxial III-N layers formed on the fin sidewalls 210A, 210B and where selective epitaxial processes are utilized (e.g., MOCVD), the isolation dielectric 241 may also be an advantageous means of reducing the semiconductor surface area where epitaxial growth occurs, reducing microloading effects, etc. While patterning of the fin may proceed in a various manners, the exemplary technique entails patterning the hard mask 243, recess etching the substrate 203 around the hard mask 243 (e.g., with a trench etch), depositing and planarizing the isolation dielectric 241 level with the hard mask 243, and the recessing the isolation dielectric 241 to expose the desired height of the fin sidewalls 210A, 210B.

Returning to FIG. 1, at operation 115 epitaxially growth upon the crystalline surfaces of the fin. The fin is to serve as both a template/seed for the growth and as a physical anchor to the substrate. Referring to FIG. 2B, any of the III-N semiconductor layers ultimately grown on the fin to be are with the c-axis perpendicular to the fin sidewalls 210A, 210B, or substantially parallel to a top surface of the substrate 203.

In the illustrated embodiment, as a first layer, a crystalline buffer, or transition layer is epitaxially formed on the (111) sidewall surfaces of the template anchor. This transition layer is to accommodate a change in lattice constant from the template surface (e.g., silicon) to the III-N semiconductor channel layer subsequently grown. The transition layer may be one or more III-N material or crystalline oxide. In certain embodiments, transition layer is advantageously of a material with a wider band gap than that of a channel layer subsequently grown over the III-N buffer for the sake of carrier confinement and therefore reduced transistor current leakage into the fin 210. For such embodiments, exemplary III-N materials include AN, AlGaN, and GaN. More specifically, for one $Al_xIn_{1-x}N$ layer, the Al mol. % is approximately 83 (e.g., $Al_{0.83}In_{0.17}N$), although the exact concentration may vary through a thickness of the transition layer. While $Al_xIn_{1-x}N$ transition layers present a number of advantages, of particular note is the relatively low epitaxial growth temperature of $Al_xIn_{1-x}N$. Whether the growth is by MBE or MOCVD, MOVPE, etc., the growth of $Al_xIn_{1-x}N$ is on the order of 300° C. lower than many alternative III-N materials. For one AlGaN embodiment, the Al mol % is no greater than 30% (e.g., $Al_{<0.3}G_{>0.7}N$), although the exact concentration may vary through a thickness of the transition layer.

Exemplary crystalline dielectrics that may be utilized as the transition layer include wurzite cyrstalline nitrides, such as TiN, SiN, AlN, and wurzite crystalline oxides, such as $Al_2O_3$, $Gd_2O_3$, $Sc_2O_3$, $Ta_2O_5$, and $TiO_2$. Such material layers are typically deposited as polycrystalline layers and then when subjected to the high growth temperature of III-N semiconductors, tend to form wurzite crystallinity suitable for III-N growth. As is further illustrated in FIG. 2B, the transition layers 215A and 215B are formed concurrently on the fin sidewalls 210A, 210B, respectively. In advantageous embodiments, III-N transition layers 215A are grown by MOCVD or MOVPE to less than 100 nm thick (with thickness being along the x-axis in FIG. 2B) while the wurzite crystalline nitrides and oxides are deposited by atomic layer deposition to a thickness of 5-10 nm.

Returning to FIG. 1, the method 101 then proceeds to either operation 117, or 118 for growth of the III-N channel semiconductor layer. Generally, the channel semiconductor layer is substantially single crystalline and although is referred to herein as "monocrystalline," one of ordinary skill will appreciate that a low level of crystal defects may nevertheless be present as artifacts of an imperfect epitaxial growth process. Generally, the III-N semiconductor in the channel layer should have relatively high carrier mobility and therefore in embodiments, the channel layer is substantially undoped group III-nitride material (i.e., impurity concentration minimized) for minimal impurity scattering.

FIG. 2B further illustrates the III-N channel semiconductor layers 217A, and 217B, disposed on the transition layers 217A, 217B. In one embodiment, at operation 117 (FIG. 1) a III-N channel including indium (In) is epitaxially grown over the transition layer. By including indium in the III-N channel (i.e., InGaN channel), the conduction band offset of the channel semiconductor from the silicon fin 210 can be increased substantially to confine charge carriers (electrons) within the channel semiconductor layer (e.g., layers 217A, 217B). Absent sufficient charge confinement, charge within the template structure may accumulate and degrade device performance (e.g., through leakage and/or parasitic channel formation). Hence, while a GaN channel offers very little conduction band offset from silicon and therefore the transition layer must further serve as a back barrier or an additional back barrier needs to be grown over the transition layer, an InGaN channel semiconductor layer can be made to have sufficient conduction band offset that the total thickness of the M-N layers grown on the epitaxial template structure can be advantageously reduced (minimized) and/or greater flexibility in choice of buffer materials is possible. In exemplary embodiments, the InGaN channel semiconductor layer includes 10-20% Indium and in certain such embodiments, the InGaN channel semiconductor layer is grown by MOCVD or MOVPE to no more than 50 nm in thickness (x-axis in FIG. 2B).

In an alternate embodiment, the method 101 proceeds to operation 118 where a GaN channel layer is grown over the transition layer. GaN is advantageous with respect to the wide band gap and associated high breakdown voltage. For such embodiment, the GaN channel semiconductor layer is again advantageously grown by MOCVD or MOVPE to no more than 50 nm in thickness. However, as described in reference to operation 117, carrier confinement within a GaN channel semiconductor layer is problematic absent a transition layer of wider band gap serving as a barrier between the silicon template and the channel. While in some embodiments, the transition layer may suffice with respect to carrier confinement, in other embodiments, such as where the transition layer is also GaN, the presence of the silicon template anchor (e.g., fin 210) may pose a problem for carrier confinement. For such embodiments, the method 101 further entails removal or material conversion of the epitaxial template anchor after it serves the growth seeding function. The silicon fin (or similar template anchor) may then be considered a sacrificial feature or a "epitaxial mandrel."

Following either operation 117 or 118, a III-N polarization layer is formed at operation 120, or 121, respectively. At operation 120 or 121, the III-N cap or polarization layer is epitaxially grown (e.g., by MOCVD or MOVPE) over the channel semiconductor layer and is functionally to serve as a charge inducing layer to controllably supply carriers in the form of a sheet of charge, commonly referred to as a 2-D electron gas (2DEG illustrated as 219A and 219B in FIG. 4A). FIG. 2B illustrates exemplary polarization layers 220A, 220B, which may range between 1 nm and 20 nm in thickness, but are advantageously less than 10 nm in thickness.

The polarization layer may further serve as a means of carrier confinement where the band gap is sufficiently wide. For the exemplary embodiments, the polarization layer is the source of sheet charge and serves a top barrier for the sake of reducing, minimizing a total thickness of the epitaxial III-N material. However, in other embodiments a compositionally distinct charge inducing layer may be utilized along with a thin top barrier layer of distinct composition to permit transistor threshold voltage tuning while ensuring a thin (e.g., >0.5 nm) wideband gap material is at the surface of the channel semiconductor layer for reduced alloy scattering and high carrier mobility As a result of different polarizations of the materials utilized in the III-N channel semiconductor layer and the polarization layer (or intervening charge inducing layer), a density of charge may be provided which can be modulated through selection of a work function metal as a gate electrode subsequently formed and/or control of the semiconductor thickness along a gate length (e.g., y-dimension in FIG. 2B for the exemplary lateral transistor and z-dimension in FIG. 2B for a vertical transistor). As such, performance characteristics of the transistor will depend on the materials chosen for the polarization layer, the channel semiconductor layer, and the gate electrode.

In embodiments of the method 101, at either operation 120 (where the channel layer is InGaN), or at operation 121 (where the channel layer is GaN), the polarization layers 220A, 220B including at least one of AlInGaN, AlGaN, AlInN, or AlN are grown on the channel semiconductor layer. In one exemplary embodiment, the polarization layers 220A, 220B have approximately 17% In. In embodiments, the polarization layers 220A, 220B have only intrinsic impurity doping level (e.g., In other embodiments, at either operation 120, or 121, a multilayer stack of group III-nitrides (e.g., an AlInN/AlN stack with the AlN layer of the stack adjacent to the channel semiconductor layers 217A, 217B) may be grown.

As further illustrated in FIG. 2B, following epitaxial growth of the III-N device layer stacks on the fin sidewalls 210A, 210B, the dielectric hard mask 243 is removed to expose the silicon fin 210, and/or a planarization of the epitaxial layers is performed.

Following operation 121 (FIG. 1), the method 101 proceeds to either operation 130, where the template anchor (e.g., silicon fin 210) is removed selectively to the epitaxial layers (e.g., selectively to the transition layers 215A, 215B, etc.), or operation 135, where the template anchor (e.g., silicon fin 210) is converted into a dielectric anchor. For either of these embodiments, the silicon fin 210 ceases to exist as a crystalline semiconductor, which is particularly advantageous where the III-N transistor is to be operated under high voltages that would otherwise induce fields in the silicon fin 210 resulting in breakdown of the silicon. Thus, in one embodiment advantageous for high breakdown voltage operation where a GaN channel layer is disposed on a GaN transition layer, removal of the silicon template serves to confine carriers and increase the breakdown voltage of the III-N transistor.

Figure 3A:
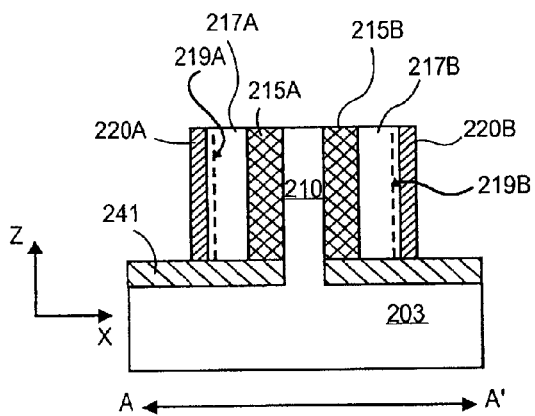
FIGS. 3A, 3B, and 3C illustrate cross-sectional views through a plane depicted in FIG. 2C after certain operations of the methods in FIG. 1 are performed in accordance with embodiments.
Figure 3B:
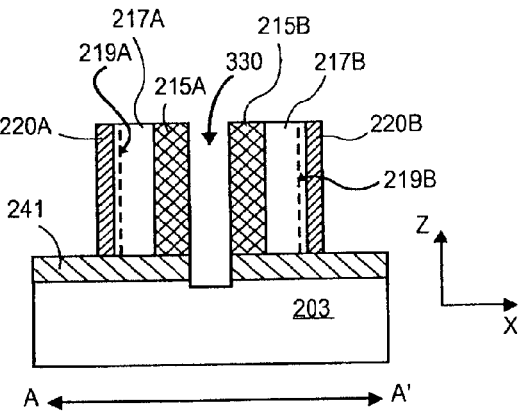
Figure 3C:
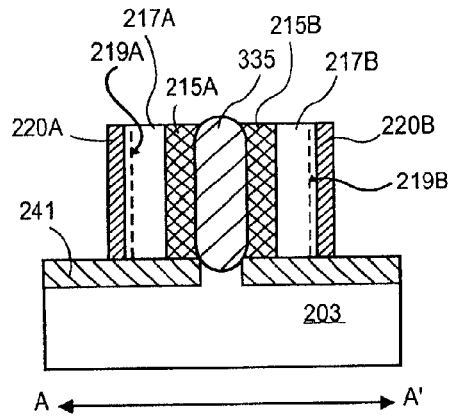

The channel region of a III-N FET in accordance with embodiments of the present invention are illustrated in FIGS. 3A, 3B, and 3C, which are sectional views corresponding to the A-A' plane depicted in FIG. 2C at a point prior to operation 160 (FIG. 1) where the gate stack (gate dielectric and gate electrode) is formed on the III-N epitaxial layers. The FIG. 3A corresponds to a point subsequent to operation 120 and the FIGS. 3B and 3C correspond to points subsequent to the operations 130 and 135, respectively.

For the embodiment illustrated by FIG. 3A, the III-N epitaxial layers are present as well as the silicon fin 210 subsequent to the operation 120. Hence, for embodiments where the channel semiconductor layer has been engineered for conduction band offset from silicon (e.g., with an InGaN channel), or where the transition layer is of a sufficiently wide band gap, the silicon fin 210 need not be sacrificial (with the method 101 then proceeding to operation 160). However, even where a conduction band offset is present, removal of the silicon fin 210 may still improve carrier confinement, and/or improve device performance in other capacities (e.g., enable higher breakdown voltage).

For the embodiment illustrated by FIG. 3B, the silicon fin 210 is etched out from the exposed top surface at operation 130 (FIG. 1) to form a gap, or trench, 330 (FIG. 3B) between the III-N epitaxial layers. Any of the many chemistries known in the art that will etch silicon, but not the III-N epitaxial layers may be utilized at operation 130. Hence, for embodiments where the channel semiconductor layer has not been engineered for conduction band offset from silicon (e.g., with an GaN channel), the silicon fin 210 is advantageously removed before proceeding to operation 160. In certain such embodiments, removal of the sacrificial epitaxial is performed subsequent to the formation of structural supports along the length of the template fin. Generally, such supports may also be formed even where subsequent removal (or conversion) of the silicon fin 210 optional, as a matter of fabricating other transistor structures, such as the gate stack, gate stack spacers, source/drains, etc. FIG. 2C illustrates supports 224 in the form of sacrificial structures that are either to be subsequently removed to form transistor source/drain regions, or a gate stacks, in the same location as the sacrificial supports 244. Alternatively, the supports 224 may be permanent structures where their making of the silicon fin removal does not pose a significant issue.

As shown in FIG. 2C, the supports 224 are to extend along only a portion of the length (y-axis) of the fin 210 so as to expose the top surface of the fin along the lengths 226 to further processing before the gate stack and/or source/drain regions are subsequently formed. In one exemplary embodiment, the three sacrificial supports 224 are composed of a sacrificial dielectric and/or polysilicon which may, for example, be blanket deposited and patterned with a plasma etch process conventional to the art. Following patterning to form the sacrificial supports 224, dielectric spacers (not depicted) may be formed on the sidewalls of the sacrificial supports 224.

For the embodiment depicted in FIG. 3C, the silicon fin 210 is converted to a silicon-based dielectric anchor, such as silicon dioxide, silicon nitride, or silicon-oxy-nitride ($SiO_xN_y$), for example by exposing top fin surface to chemical treatment at operation 135 (FIG. 1) that forms the dielectric anchor 335 (FIG. 3C) between the III-N epitaxial layers. For such embodiments, the formation of the supports 224 (FIG. 2C) may be formed before or after conversion of the anchor, or may be avoided all together. The small silicon volume that results from the nanoscale dimensioning of the fin facilitates conversion of the fin into the dielectric anchor. For example, being less than 100 nm in height, the entire height of the fin can be oxidized at operation 135 (FIG. 1) with moderate thermal and/or plasma oxidation and/or nitridation processing conditions. Furthermore, the change in volume associated with the oxidation or nitridation of silicon is reduced with the fin width (WF) being 20 nm or less, such that the magnitude of expansion associated with the silicon conversion can be accommodated by strain in III-N epitaxial layers. Indeed, amorphization of the silicon fin 210 during the dielectric conversion may permit further reduction in the stress (strain) of the III-N epitaxial layers and/or further reduction in defect density relative to their "as-grown" state.

Figure 4A:
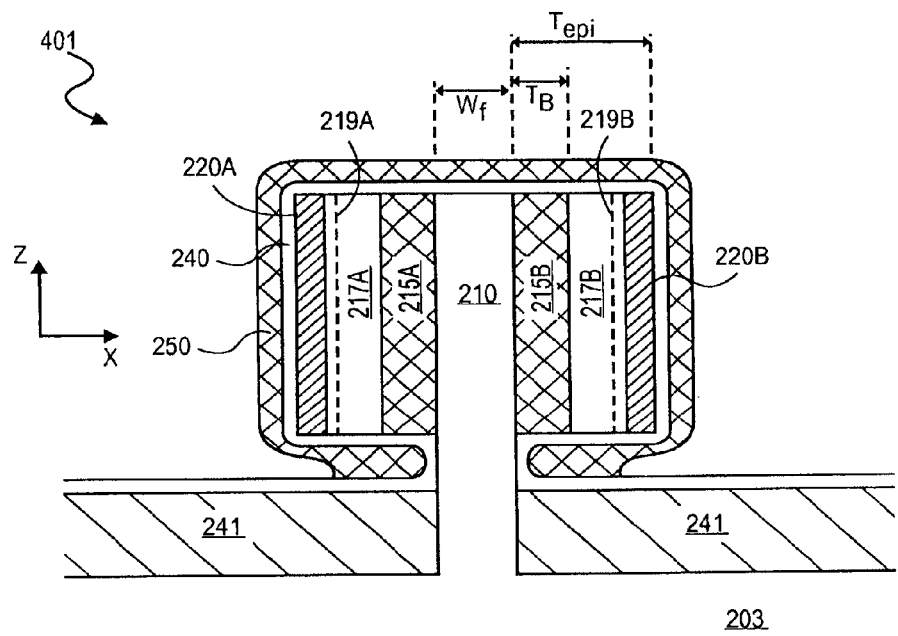
FIGS. 4A, 4B, and 4C illustrates a cross-section through a channel region of a III-N FET, in accordance with an embodiment.
Figure 4B:
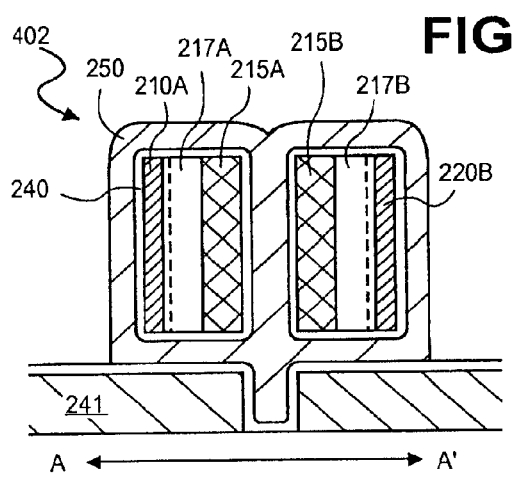
Figure 4C:
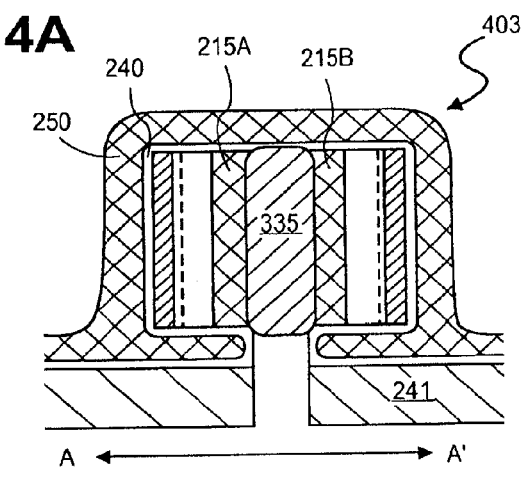

With the structured epitaxial growths complete and the silicon template fin optionally treated or removed to improve carrier confinement, the method 101 completes with formation of a conformal gate stack at operation 160. Doping or epitaxy of source drain regions may also then be performed on opposite sides of the gate stack, although not depicted in FIG. 1. Formation of the gate stack and/or source drain regions may take place with the device structure as depicted in FIG. 2C, either with the gate stack deposited within the lengths 226, or upon removal of the supports 224. FIGS. 4A, 4B, and 4C illustrate cross-sections of III-N FETs 401, 402, 403, respectively, along a plane passing through a channel portion of the FETs such that the c-axis of the III-N layers is coincident with the x-axis in the FIGS. 4A-4C. As shown in FIG. 4A, on each sidewall of a silicon fin 210, having a width WF advantageously less than 20 nm, is an epitaxial stack of thickness $T_{epi}$ that is advantageously less than 200 nm, with the thickness TB of the transition layers 215A, 215B advantageously less than 100 nm. The channel semiconductor layers 217A, 217B each have a 2DEG 219A and 219B, respectively with current flow of the III-N FET 401 along the y-axis (out of the page in FIG. 4A).

Disposed over the polarization layers 220A, 220B is a conformal gate dielectric 240, such as, but not limited to one or more layers of silicon nitride ($Si_xN_y$), silicon dioxide ($SiO_2$), alumina ($Al_2O_3$), $Gd_2O_3$, $HfO_2$, high-K silicates such as HfOSiO, TaSiO, AlSiO, and high-K oxynitrides such as HfON, SiON, AlON, ZrSiON, HfSiON, or a group III-ON. In embodiments, the gate dielectric 240 includes a dielectric layer to passivate the interface between gate electrode 250 and c-plane surfaces ({0001} planes) of the III-N epitaxial stack to preserve high channel mobility and reduce gate leakage current. In one embodiment, the gate dielectric 240 is deposited by ALD for adequate sidewall surface coverage.

Disposed over the gate dielectric 240 is the gate electrode layer 250 including a work function metal selected to obtain a desired transistor threshold voltage (Vt) (e.g., greater than 0V, etc) with exemplary conductive gate materials include, tungsten (W), aluminum (Al), titanium (Ti), tantalum (Ta), nickel (Ni), molybdenum (Mo), germanium (Ge), platinum (Pt), gold (Au), ruthenium (Ru), palladium (Pd), iridium (Ir), their alloys, silicides, carbides, nitrides, and phosphides. In an embodiment, the gate electrode layer 250 is deposited by ALD for adequate sidewall surface coverage.

For the exemplary embodiments illustrated in FIGS. 4A, 4B, and 4C, the III-N transistors employ two identical channel regions (e.g., 2DEG 219A, 219B) with conduction properties controlled in parallel by the potential on the gate electrode layer 250. Hence, the effective current carrying width of the 2DEG for the III-N MOS transistors is equal approximately twice the height of the silicon fin 210 (HF) upon which the III-N epitaxial stacks were grown. Therefore, even with the polar nature of the III-N MOS transistor, a plurality of transistor channels are formed from each silicon fin.

As further illustrated in FIG. 4A, the transistor 401 retains the silicon fin 210 in the final transistor structure. For the transistor 402 depicted in FIG. 4B however, where the silicon fin 210 has been removed prior to formation of the gate stack, the gate dielectric layer 240 directly contacts the transition layer 215A, 215B. The gate electrode layer 250 is further disposed between the transition layers 215A, 215B and isolated from the epitaxial layers by the conformal gate dielectric layer 240. In the exemplary embodiment, the isolation dielectric 241 is recessed prior to the gate stack formation (e.g., before or after silicon fin removal), allowing the gate dielectric 240 and gate metal to wrap completely around the two III-N epitaxial layer stacks. FIG. 4C illustrates a channel region of a transistor 403 that includes the silicon-based dielectric fin 335 disposed between the transition layers 215A and 215B. For such embodiments, the gate dielectric 240 may, or may not wrap completely around the pair of III-N epitaxial layer stacks as a function of whether the isolation dielectric 241 is recessed before gate stack formation and whether the dielectric fin 335 is undercut during by the recess etch.

Figure 5:
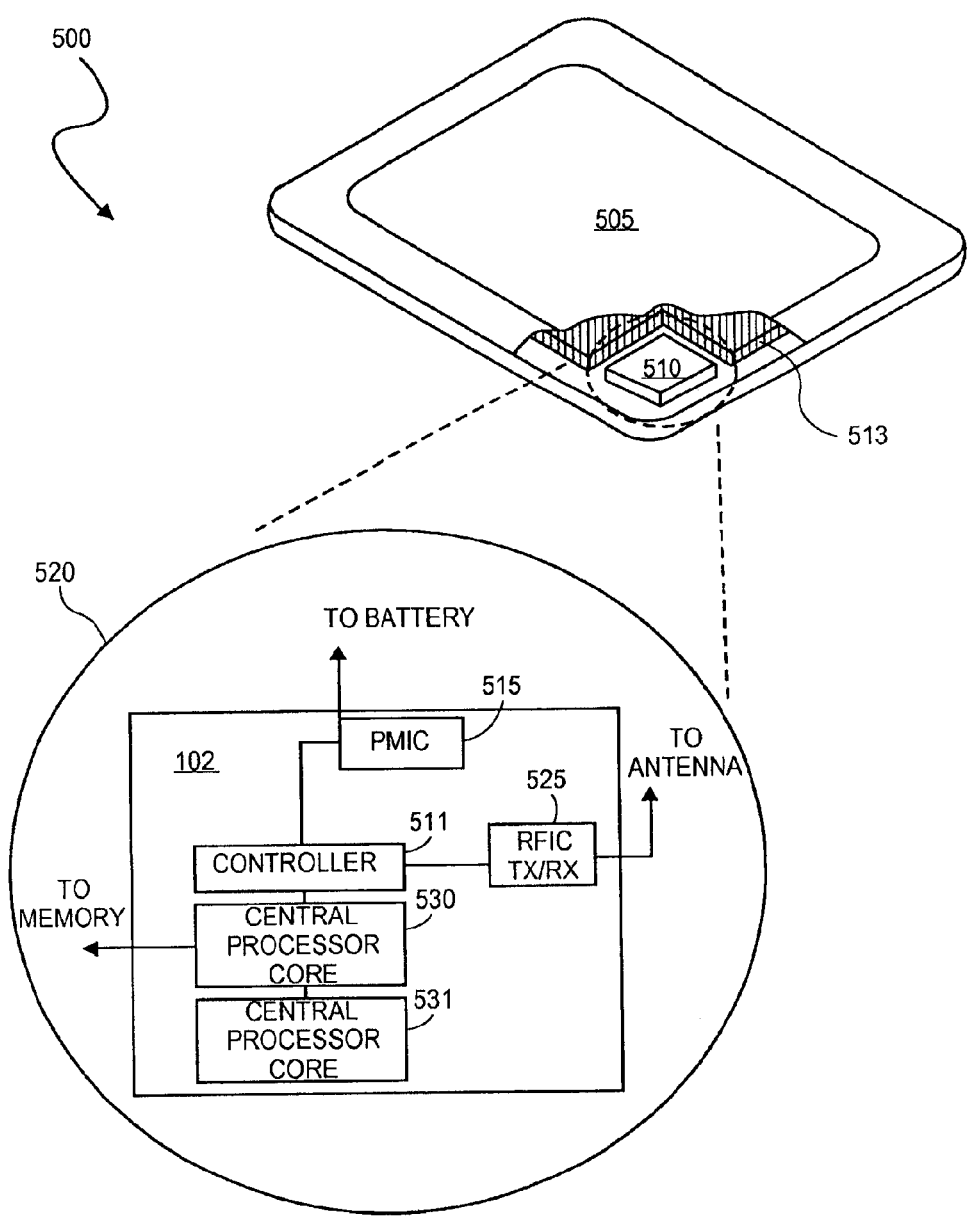
FIG. 5 is a functional block diagram of a group III-N SoC implementation of a mobile computing device, in accordance with an embodiment of the present invention.

FIG. 5 is a functional block diagram of a SoC implementation of a mobile computing platform, in accordance with an embodiment of the present invention. The mobile computing platform 500 may be any portable device configured for each of electronic data display, electronic data processing, and wireless electronic data transmission. For example, mobile computing platform 500 may be any of a tablet, a smart phone, laptop computer, etc. and includes a display screen 505 that is in the exemplary embodiment a touchscreen (e.g., capacitive, inductive, resistive, etc.) permitting the receipt of user input, the SoC 510, and a battery 513. As illustrated, the greater the level of integration of the SoC 510, the more of the form factor within the mobile computing platform 500 that may be occupied by the battery 513 for longest operative lifetimes between charging, or occupied by memory (not depicted), such as a solid state drive, for greatest functionality.

Depending on its applications, mobile computing platform 500 may include other components including, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The SoC 510 is further illustrated in the expanded view 520. Depending on the embodiment, the SoC 510 includes a portion of a substrate 102 (i.e., a chip) upon which two or more of a power management integrated circuit (PMIC) 515, RF integrated circuit (RFIC) 525 including an RF transmitter and/or receiver, a controller thereof 511, and one or more central processor core 530, 531 is fabricated. The RFIC 525 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The RFIC 525 may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As will be appreciated by one of skill in the art, of these functionally distinct circuit modules, CMOS transistors are typically employed exclusively except in the PMIC 515 and RFIC 525. In embodiments of the present invention, the PMIC 515 and RFIC 525 employ one or more of the group III-nitride transistors as described herein (e.g., group III-nitride transistor 401) utilizing an embodiment of the horizontal c-axis III-N epitaxial stacks described herein. In further embodiments the PMIC 515 and RFIC 525 employing the group III-nitride transistors described herein are integrated with one or more of the controller 511 and processor cores 530, 531 provided in silicon CMOS technology monolithically integrated with the PMIC 515 and/or RFIC 525 onto the (silicon) substrate 102. It will be appreciated that within the PMIC 515 and/or RFIC 525, the high voltage, high frequency capable group III-nitride transistors described herein need not be utilized in exclusion to CMOS, but rather silicon CMOS may be further included in each of the PMIC 515 and RFIC 525.

The group III-nitride transistors described herein may be specifically utilized where a high voltage swings present (e.g., 7-10V battery power regulation, DC-to-DC conversion, etc. within the PMIC 515). As illustrated, in the exemplary embodiment the PMIC 515 has an input coupled to the battery 513 and has an output provide a current supply to all the other functional modules in the SoC 510. In a further embodiment, where additional ICs are provided within the mobile computing platform 500 but off the SoC 510, the PMIC 515 output further provides a current supply to all these additional ICs off the SoC 510.

As further illustrated, in the exemplary embodiment the PMIC 515 has an output coupled to an antenna and may further have an input coupled to a communication module on the SoC 510, such as an RF analog and digital baseband module (not depicted). Alternatively, such communication modules may be provided on an IC off-chip from the SoC 510 and coupled into the SoC 510 for transmission. Depending on the group III-nitride materials utilized, the group III-nitride transistors described herein (e.g., III-N transistor 401) may further provide the large power added efficiency (PAE) needed from a power amplifier transistor having an Ft of at least ten times carrier frequency (e.g., a 1.9 GHz in an RFIC 525 designed for 3G or GSM cellular communication).

Figure 6:
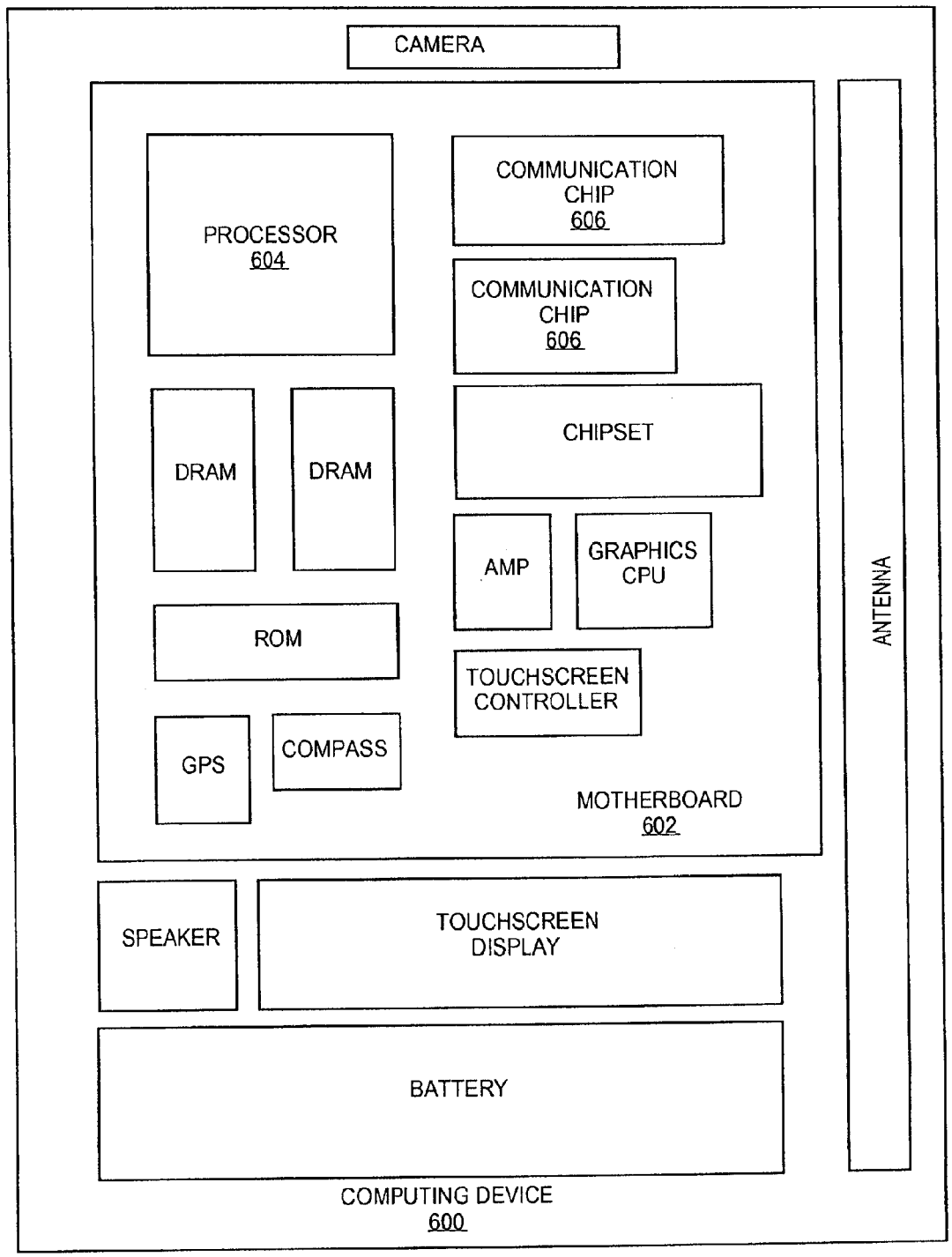
FIG. 6 illustrates a functional block diagram of a computing device in accordance with one implementation of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter-range wireless communications such as Wi-Fi and Bluetooth and a second communication chip 606 may be dedicated to longer-range wireless communications such as GPS, EDGE, GPRS, CDMA, WiMAX, LTE, Ev-DO, and others.

The processor 604 of the computing device 600 includes an integrated circuit die packaged within the processor 604. In some embodiments of the invention, the integrated circuit die of the processor includes one or more devices, such as MOS-FETs built in accordance with embodiments described elsewhere herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another embodiment of the invention, the integrated circuit die of the communication chip includes one or more devices, such as MOS-FETs with features and/or fabricated in accordance with embodiments described elsewhere herein.

In further implementations, another component housed within the computing device 600 may contain an integrated circuit die that includes one or more devices, such as MOS-FETs with features and/or fabricated in accordance with embodiments described elsewhere herein.

In embodiments, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

It is to be understood that the above description is illustrative, and not restrictive. For example, while flow diagrams in the figures show a particular order of operations performed by certain embodiments of the invention, it should be understood that such order may not be required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A III-N field effect transistor (FET), comprising:
    first and second group III-N device layer stacks physically separated from one another and disposed above a silicon substrate, wherein each of the group III-N device layer stacks comprises a channel semiconductor layer; and
    a gate stack disposed over the III-N device layer stacks, adjacent sidewalls of each of the III-N device layer stacks, and below each of the III-N device layer stacks, wherein the gate stack anchors the III-N device layer stacks to the silicon substrate.

2. The III-N FET of claim 1, wherein the channel semiconductor layer comprises InGaN with 20% In, or less.

3. The III-N FET of claim 1, wherein each of the III-N device layer stacks further comprises:
    a channel semiconductor layer of GaN disposed on a transition layer; and
    a polarization layer of AlN, AlInN, AlGaN, or AlInGaN disposed on the GaN channel semiconductor layer.

4. The III-N FET of claim 3, wherein the transition layer further comprises a material selected from the group consisting of a crystalline oxide, AlN, AlInN, and AlGaN.

5. The III-N FET of claim 1, wherein the gate stack completely surrounds each of the III-N device layer stacks.

6. A method of fabricating a III-N field effect transistor (FET), the method comprising:
    forming first and second group III-N device layer stacks above a silicon substrate, wherein the group III-N device layer stacks are physically separated from one another, and wherein each of the group III-N device layer stacks comprises a channel semiconductor layer; and
    forming a gate stack over the III-N device layer stacks, adjacent sidewalls of each of the III-N device layer stacks, and below each of the III-N device layer stacks, wherein forming the gate stack anchors the III-N device layer stacks to the silicon substrate.

7. The method of claim 6, wherein forming the III-N device layer stacks comprises forming the channel semiconductor layer comprising InGaN with 20% In, or less.

8. The method of claim 6, wherein forming each of the III-N device layer stacks further comprises:
    forming a channel semiconductor layer of GaN disposed on a transition layer; and
    forming a polarization layer of AlN, AlInN, AlGaN, or AlInGaN on the GaN channel semiconductor layer.

9. The method of claim 8, wherein forming the transition layer further comprises forming a material selected from the group consisting of a crystalline oxide, AlN, AlInN, and AlGaN.

10. The method of claim 6, wherein forming the gate stack comprises forming the gate stack to completely surround each of the III-N device layer stacks.

* * * * *